United States Patent
Kim et al.

(10) Patent No.: US 8,829,645 B2
(45) Date of Patent: Sep. 9, 2014

(54) STRUCTURE AND METHOD TO FORM E-FUSE WITH ENHANCED CURRENT CROWDING

(75) Inventors: Deok-Kee Kim, Bedford Hills, NY (US); Ahmet S Ozcan, Pleasantville, NY (US); Haining S Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 237 days.

(21) Appl. No.: 12/137,640

(22) Filed: Jun. 12, 2008

(65) Prior Publication Data

US 2009/0309184 A1 Dec. 17, 2009

(51) Int. Cl.
*H01L 23/52* (2006.01)

(52) U.S. Cl.
USPC .............. 257/529; 257/209; 257/E23.149; 438/132; 438/215; 438/281; 438/333; 438/467

(58) Field of Classification Search
USPC .......... 257/209, 529, E23.149; 438/132, 215, 438/281, 333, 467
See application file for complete search history.

(56) References Cited

U.S. PATENT DOCUMENTS

| 5,882,998 A | 3/1999 | Sur, Jr. et al. |
| 7,067,359 B2 | 6/2006 | Wu |
| 2006/0071213 A1 | 4/2006 | Ma et al. |
| 2007/0252237 A1* | 11/2007 | Ko et al. ............. 257/529 |
| 2008/0029843 A1 | 2/2008 | Booth, Jr. et al. |
| 2008/0050903 A1 | 2/2008 | Booth, Jr. et al. |
| 2008/0067629 A1* | 3/2008 | Miyashita ............. 257/535 |

OTHER PUBLICATIONS

U.S. Appl. No. 13/453,165, Office Action Communication, Sep. 6, 2012, pp. 1-21.
U.S. Appl. No. 13/453,165, Office Action Communication, Feb. 28, 2013, pp. 1-26.
U.S. Appl. No. 13/453,165, Notice of Allowance dated Apr. 8, 2014, 9 pages.

* cited by examiner

*Primary Examiner* — Mark Tornow
(74) *Attorney, Agent, or Firm* — Gibb & Riley, LLC

(57) ABSTRACT

An e-fuse structure and method has an anode; a fuse link (a first end of the fuse link is connected to the anode); a cathode (a second end of the fuse link opposite the first end is connected to the cathode); and a silicide layer on the fuse link. The silicide layer has a first silicide region adjacent the anode and a second silicide region adjacent the cathode. The second silicide region comprises an impurity not contained within the first silicide region. Further, the first silicide region is thinner than the second silicide region.

14 Claims, 5 Drawing Sheets

STRUCTURE AND METHOD TO FORM E-FUSE WITH ENHANCED CURRENT CROWDING

BACKGROUND

1. Field of the Invention

The embodiments of the invention generally relate to e-fuse structures and methods, and more particularly to an e-fuse method and structure with enhanced current crowding.

2. Description of the Related Art

E-fuses (electronic fuses) are used in many computerized devices, such as integrated circuits, for a number of purposes, such as array redundancy, field array programming, chip-id trimming, etc. E-fuses have many advantages compared to laser fuses, because they are scalable, less prone to collateral damage, and are field level programmable. The blowing or programming of e-fuses occurs by inducing electro-migration of silicide. After programming, the resistance of the fuse is much higher than before programming.

This electro-migration is determined by a number of factors such as: current density, resistivity, and temperature. One expression of a measure (V) of electro-migration is as follows: $V \sim J*R*\exp(-Q/kT)/kT$, where J=current density, R=film resistivity, Q=activation energy, and T=temperature.

However, as circuits progress, the programming current requirements are reduced and the power supply voltage and chip area required for programming transistors are minimized. The embodiments described below address such issues.

SUMMARY

This disclosure presents method and structure embodiments that produce current crowding in the fuse link, which allows the e-fuses to be blown using lower voltages/currents. One method of forming an e-fuse structure herein comprises patterning a conductor on a substrate to form an anode, a fuse link, and a cathode. This patterning is performed in such a manner that a first end of the fuse link is connected to the anode, and a second end of the fuse link opposite the first end is connected to the cathode. The method forms an impurity in part of the fuse link adjacent the cathode. The impurity is formed in such a manner that the fuse link comprises a first fuse link region adjacent the anode and a second fuse link region adjacent the cathode. The second fuse link region comprises the impurity, while the first fuse link region does not contain the impurity. The method silicides the fuse link to form a silicide layer on the fuse link. This siliciding process is performed in such a manner that the silicide layer has a first silicide region above the first fuse link region and a second silicide region above the second fuse link region. The second silicide region comprises the impurity, and the first silicide region does not contain the impurity.

This process produces a number of structure embodiments. One structure embodiment comprises an e-fuse structure that has an anode; a fuse link (a first end of the fuse link is connected to the anode); a cathode (a second end of the fuse link opposite the first end is connected to the cathode); and a silicide layer on the fuse link. The silicide layer has a first silicide region adjacent the anode and a second silicide region adjacent the cathode. The second silicide region comprises an impurity not contained within the first silicide region. Further, the first silicide region is thinner than the second silicide region.

An e-fuse structure comprising an anode; a fuse link, a first end of said fuse link being connected to said anode; a cathode, a second end of said fuse link opposite said first end being connected to said cathode; and a silicide layer on said fuse link, said silicide layer having a first silicide region adjacent said anode and a second silicide region adjacent said cathode, said second silicide region comprising an impurity not contained within said first silicide region, and said first silicide region being thinner than said second silicide region.

These and other aspects of the embodiments of the invention will be better appreciated and understood when considered in conjunction with the following description and the accompanying drawings. It should be understood, however, that the following descriptions, while indicating embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF EMBODIMENTS

Figure 1:
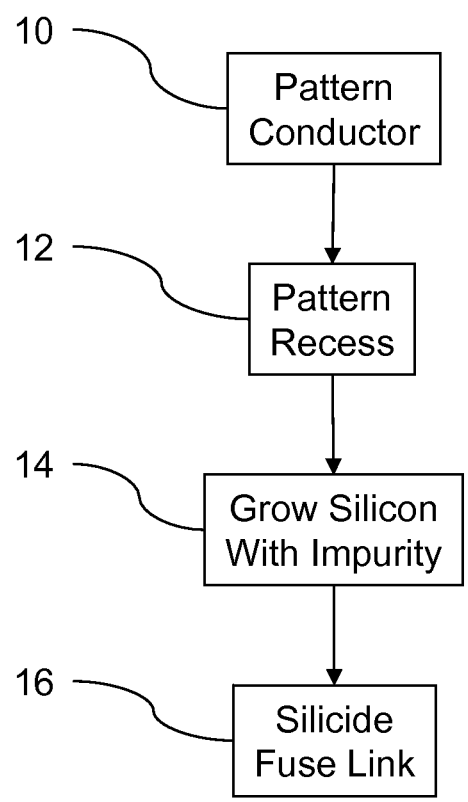
FIG. 1 is a flow diagram illustrating method embodiments herein.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, this disclosure presents method and structure embodiments that produce current crowding in the fuse link, which allows the e-fuses to be blown using lower voltages/currents. As shown in flowchart form in FIG. 1, one method of forming an e-fuse structure comprises patterning a conductor (e.g, polysilicon, or any other conductor whether now know or developed in the future) on a substrate 10 to form an anode, a fuse link, and a cathode. This patterning is performed in such a manner that a first end of the fuse link is connected to the anode, and a second end of the fuse link opposite the first end is connected to the cathode.

The method forms an impurity in part of the fuse link adjacent the cathode in items 12-14. The process of forming of impurity comprises patterning a recess in the second fuse link region 12, and growing silicon with an impurity (e.g., germanium, xenon, arsenic, etc.) in the recess 14. The impurity is formed in such a manner that the fuse link comprises a first fuse link region adjacent the anode and a second fuse link region adjacent the cathode. The second fuse link region comprises the impurity, while the first fuse link region does not contain the impurity.

The method then silicides the fuse link 18 to form a silicide layer on the fuse link. This siliciding process 18 is performed in such a manner that the silicide layer has a first silicide region above the first fuse link region and a second silicide region above the second fuse link region. The second silicide region comprises the impurity, and the first silicide region does not contain the impurity. This siliciding process is performed such that the second silicide region has a higher electrical resistance than the first silicide region and such that the second silicide region is thinner than the first silicide region.

Figure 2:
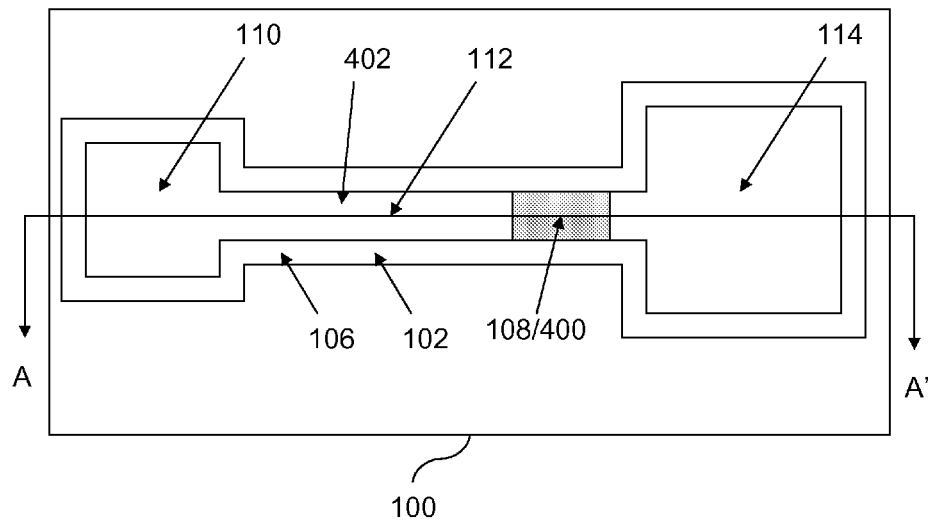
FIG. 2 is a top view of an e-fuse structure according to embodiments herein.
Figure 4:
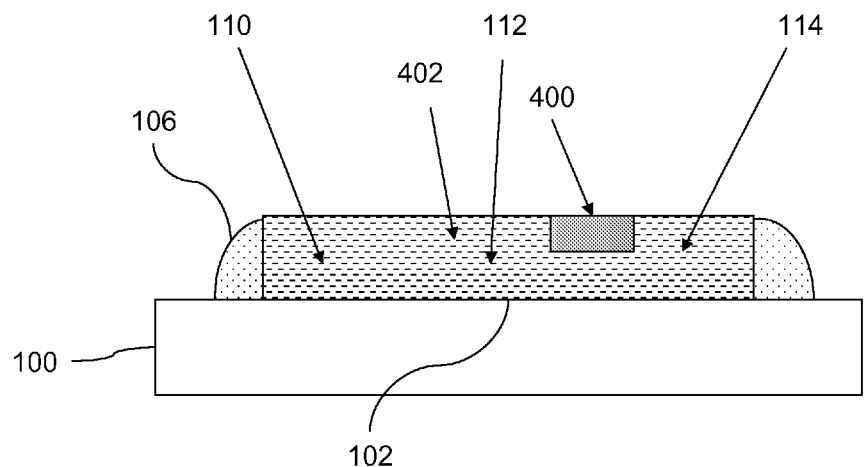
FIG. 4 is a cross-sectional view of an e-fuse structure according to embodiments herein.
Figure 5:
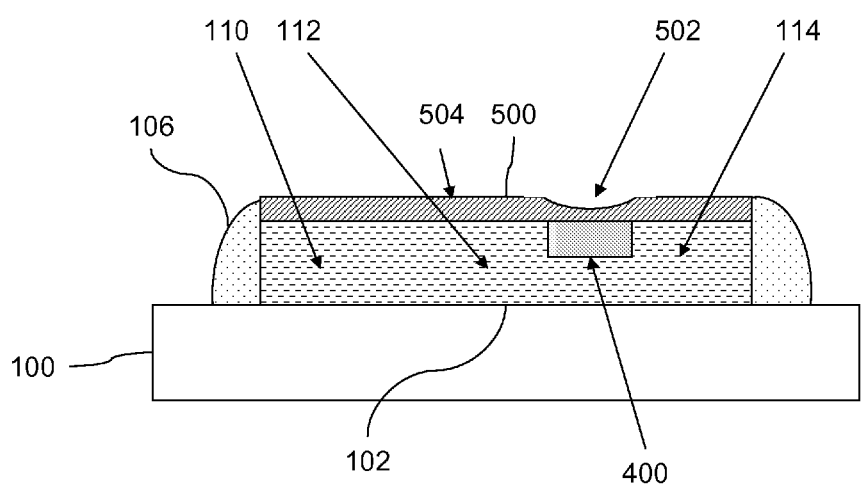
FIG. 5 is a cross-sectional view of an e-fuse structure according to embodiments herein.
Figures 6, 7:
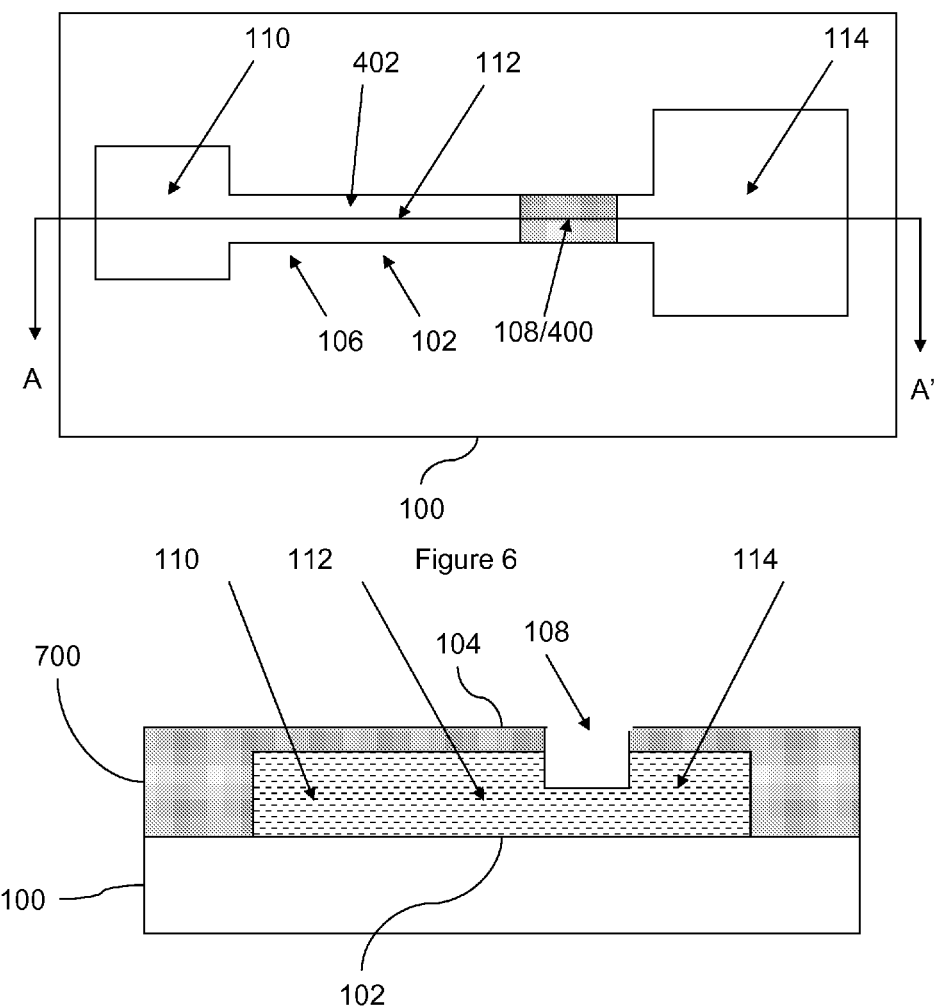
FIG. 6 is a top view of an e-fuse structure according to embodiments herein.
FIG. 7 is a cross-sectional view of an e-fuse structure according to embodiments herein.

This process is similarly shown schematically in FIGS. 2-10. More specifically, one embodiment is shown in FIGS. 2-5 and another embodiment is shown in FIGS. 6-10. FIGS. 2 and 6 illustrate an e-fuse in top (plan) view, while FIGS. 3-5 and 7-10 illustrate the same structure in cross-section along line A-A'.

Figure 3:
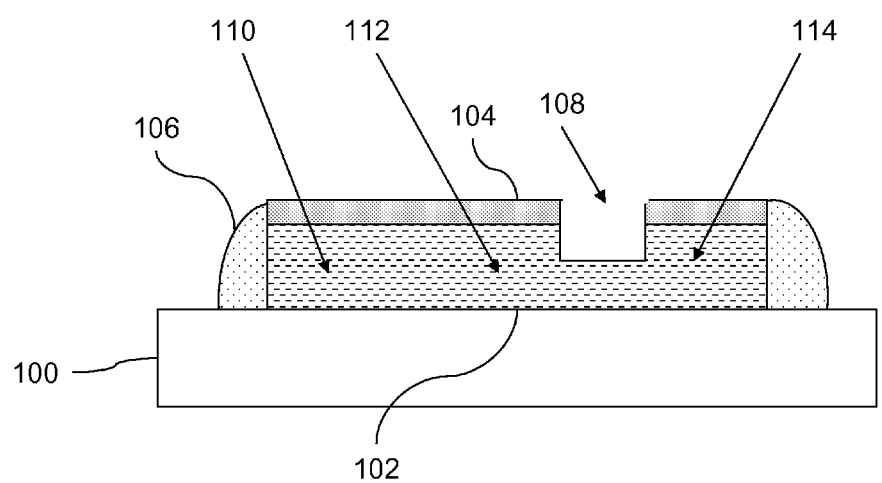
FIG. 3 is a cross-sectional view of an e-fuse structure according to embodiments herein.

FIGS. 2 and 3 illustrate a conductor 102 (e.g., polysilicon, or any other conductor whether now know or developed in the future) on a substrate 100 patterned to form an anode 110, a fuse link 112, and a cathode 114. This patterning is performed in such a manner that a first end of the fuse link 112 is connected to the anode 110, and a second end of the fuse link 112 opposite the first end is connected to the cathode 114. Processes and the materials used for patterning e-fuse conductors, doping, forming recesses, siliciding, etc. are well known to those ordinarily skilled in the art and are not discussed in detail herein to maintain focus on the salient portions of the invention. For examples of such conventional teachings, see U.S. Patent Publications 2008/0050903 and 2008/0029843, which are fully incorporated herein by reference.

The method forms an impurity in part of the fuse link 112 adjacent the cathode 114. The process of forming of impurity comprises patterning a recess 108 in the second fuse link region 400 (using any conventional patterning method, such as masking and etching) as shown in FIG. 3, and growing silicon with an impurity (e.g., germanium, xenon, arsenic, etc.) 400 in the recess 108 as shown in FIG. 4. Processes and the materials used for epitaxially growing materials conductors, doping, etc. are well known to those ordinarily skilled in the art and are not discussed in detail herein to maintain focus on the salient portions of the invention. For an example of such conventional teachings, see U.S. Pat. No. 7,244,958, which is fully incorporated herein by reference.

The impurity is formed in such a manner that the fuse link 112 comprises a first fuse link region 402 adjacent the anode 110 and a second fuse link region 400 adjacent the cathode 114. The second fuse link region 400 comprises the impurity, while the first fuse link region 402 does not contain the impurity. In addition, spacers 106 can be formed around the conductor 102 prior to forming the impurity.

As shown in FIG. 5, the method then silicides the fuse link 112 to form a silicide layer 500 on the fuse link 112. As discussed in the previously incorporated conventional teachings, siliciding of polysilicon can be accomplished by deposition of nickel, cobalt, tungsten, titanium, tantalum, or other metal capable of reacting with silicon to form a low resistivity, thermally stable silicide. This siliciding process is performed in such a manner that the silicide layer 500 has a first silicide region 504 above the first fuse link region 402 and a second silicide region 502 above the second fuse link region 400. The second silicide region 502 comprises the impurity, and the first silicide region 504 does not contain the impurity. This siliciding process is performed such that the second silicide region 502 has a higher electrical resistance than the first silicide region 504 and such that, as shown in FIG. 5, the second silicide region 502 is thinner than the first silicide region 504.

The impurity within the second fuse link region 400 allows the second diffusely region 400 to act as a diffusion barrier during the silicide process. In other words, the diffusion barrier 400 slows the diffusion rate of the silicide metal into the silicon 102 during the silicide process. Thus, because of the presence of the diffusion barrier 400, more silicon 102 reacts with the silicide metal in the first silicide region 504 when compared to the second silicide region 502. Therefore, if for example, nickel were utilized as the silicide metal, less nickel would be able to diffuse through to the silicon 102 because of the diffusion barrier 400, thereby making the resistivity of the second silicide region 502 higher than that of the first silicide region 504.

Thus, the silicide thickness or morphology is sensitive to the material property of the substrate 100 on which it is formed. In these embodiments, a region of the polysilicon fuse is substituted with an impurity (e.g., SiGe; SiC; SiB; SiP) and the silicide formed on top of doped silicon has a different resistivity than that formed on undoped polysilicon. In general, the silicide on top of doped silicon is thinner and has a higher resistance. The different silicide thicknesses of the silicide above the doped polysilicon region result from the fact that silicide is harder to form on a silicon-impurity than on pure silicon.

Figure 8:
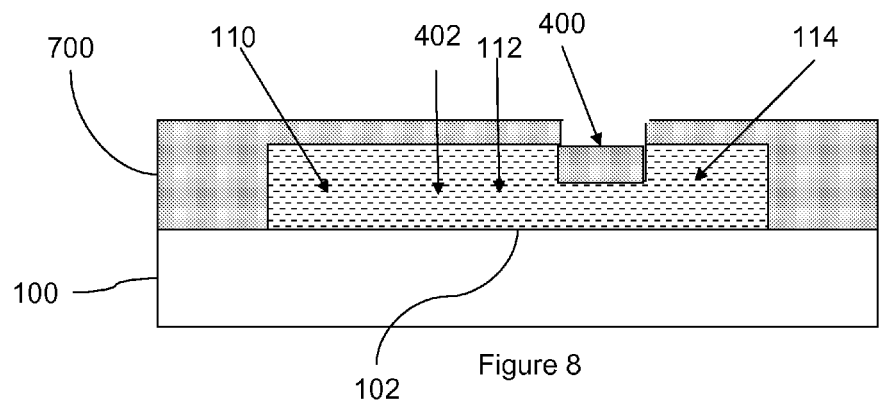
FIG. 8 is a cross-sectional view of an e-fuse structure according to embodiments herein.
Figure 9:
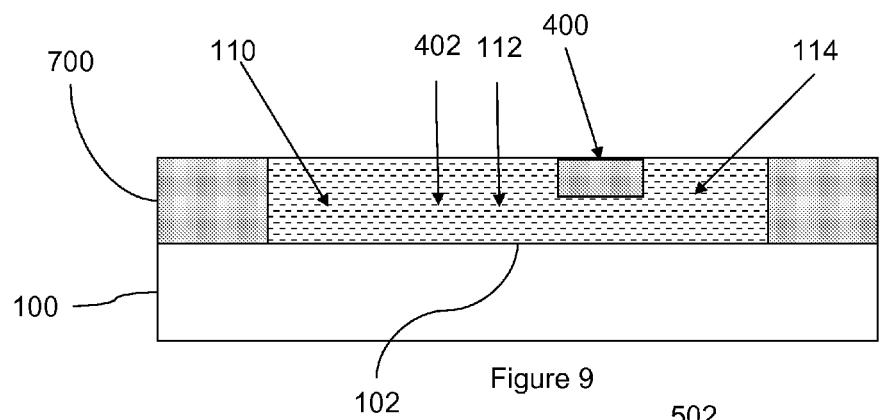
FIG. 9 is a cross-sectional view of an e-fuse structure according to embodiments herein.

An alternative embodiment is shown in FIGS. 6-10, where the same features are identified with the same identification numbers that were used in the embodiment shown in FIGS. 2-5. In this embodiment, a nitride layer 700 is formed over and around the conductor 102 instead of the spacer 106 (as shown in FIGS. 6 and 7). In a similar manner to that shown above, the doped polysilicon 400 is grown in the recess 108 and then the upper portion of nitride 700 is removed (as shown in FIGS. 8 and 9). The silicide 500 is formed and insulator 1000 is formed around the structure.

Figure 10:
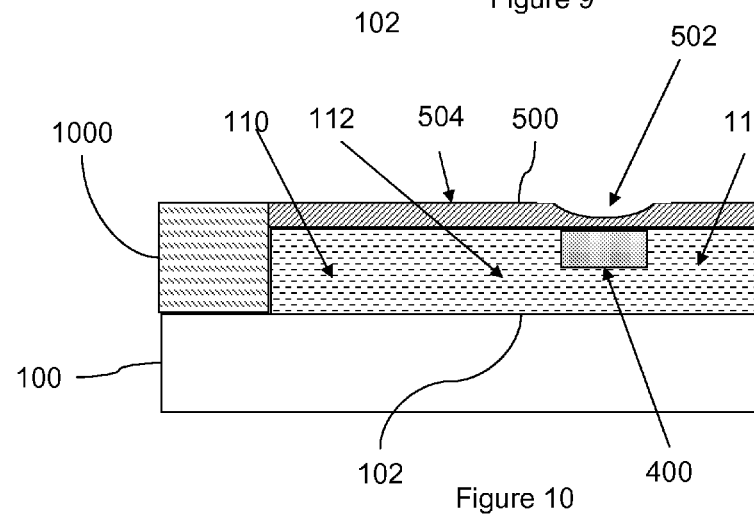
FIG. 10 is a cross-sectional view of an e-fuse structure according to embodiments herein.

This process produces a number of structure embodiments, as shown for example in FIGS. 5 and 10. These e-fuse structures have an anode 110; a fuse link 112 (a first end of the fuse link 402 is connected to the anode 110); a cathode 114 (a second end of the fuse link 400 opposite the first end is connected to the cathode 114); and a silicide layer 500 on the fuse link 112. The silicide layer 500 has a first silicide region 504 adjacent the anode 110 and a second silicide region 502 adjacent the cathode 114. The second silicide region 502 comprises an impurity not contained within the first silicide region 504. The impurity can comprise germanium, xenon, arsenic, etc. and the silicide can comprise any silicide of nickel, cobalt, tungsten, titanium, tantalum, or other metal capable of reacting with silicon.

Further, the first silicide region 504 is thinner than the second silicide region 502. These structural features cause the second silicide region 502 to have a higher electrical resistance than the first silicide region 504. Also, the first silicide region 504 covers more than one half of the fuse link 112 and the second silicide region 502 covers less than one half of the fuse link 112.

A first fuse link region 402 is below the first silicon region and a second fuse link region 400 is below the second silicon region, the second silicon region comprises the impurity. However, the impurity is not contained within the first silicon region.

Thus, the embodiments herein provide an e-fuse link 112 with a silicide diffusion barrier where the cathode 114 has thicker silicide, and the anode 110 and the fuse link 112 has a thinner metal silicide, this structure increases flux divergence due to electro-migration and, hence, increases post programming resistance. As shown in the previous embodiments, an impurity is selectively formed to create silicides of different thicknesses. With e-fuses, current crowding causes the current density to be accentuated at the corner of the fuse links where the thickness changes. As the input current to the fuse is increased, a current density is reached at this corner which causes electro-migration and eventual blowing of the fuse.

Therefore, the embodiments herein allow a programmed e-fuse to have a higher resistance (because of the thinner silicide region), which allows the e-fuses to be programming with a smaller amount of energy (current/voltage). This reduces voltage requirements and also reduces the likelihood that the fuse link will rupture during programming to be prevented.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of embodiments, those skilled in the art will recognize that the embodiments of the invention can be practiced with modification within the spirit and scope of the appended claims.

What is claimed is:

1. An e-fuse structure comprising:
   an anode;
   a fuse link, a first end of said fuse link being connected to said anode;
   a cathode, a second end of said fuse link opposite said first end being connected to said cathode; and
   a silicide layer on said fuse link,
   said silicide layer having a first silicide region adjacent said anode and a second silicide region adjacent said cathode, said second silicide region comprising a greater concentration of a silicide metal relative to the concentration of silicide metal in said first silicide region,
   the difference in concentration of silicide metal between said first silicide region and said second silicide region defining an enhanced flux divergence region located a distance from said cathode on said fuse link equal to a width of said fuse link.

2. The e-fuse structure according to claim 1, said second silicide region having a higher electrical resistance than said first silicide region.

3. The e-fuse structure according to claim 1, said fuse link comprising a first fuse link region below said first silicide region and a second fuse link region below said second silicide region, said second silicide region comprising an impurity.

4. The e-fuse structure according to claim 3, said impurity not being contained within said first silicide region.

5. The e-fuse structure according to claim 3, said impurity comprising one of germanium, xenon, and arsenic.

6. The e-fuse structure according to claim 1, said silicide comprising one of a silicide of nickel, cobalt, tungsten, titanium, tantalum, and other metal capable of reacting with silicon.

7. The e-fuse structure according to claim 1, said first silicide region covering more than one half of said fuse link and said second silicide region covering less than one half of said fuse link.

8. An e-fuse structure comprising:
   an anode;
   a fuse link, a first end of said fuse link being connected to said anode;
   a cathode, a second end of said fuse link opposite said first end being connected to said cathode; and
   a silicide layer on said fuse link,
   said silicide layer having a first silicide region adjacent said anode and a second silicide region adjacent said cathode, said second silicide region comprising a greater concentration of a silicide metal relative to the concentration of silicide metal in said first silicide region,
   the difference in concentration of silicide metal between said first silicide region and said second silicide region defining an enhanced flux divergence region located a distance from said cathode on said fuse link equal to a width of said fuse link, and
   said second silicide region being thinner than said first silicide region.

9. The e-fuse structure according to claim 8, said second silicide region having a higher electrical resistance than said first silicide region.

10. The e-fuse structure according to claim 8, said fuse link comprising a first fuse link region below said first silicide region and a second fuse link region below said second silicide region, said second silicide region comprising an impurity.

11. The e-fuse structure according to claim 10, said impurity not being contained within said first silicide region.

12. The e-fuse structure according to claim 10, said impurity comprising one of germanium, xenon, and arsenic.

13. The e-fuse structure according to claim 8, said silicide comprising one of a silicide of nickel, cobalt, tungsten, titanium, tantalum, and other metal capable of reacting with silicon.

14. The e-fuse structure according to claim 8, said first silicide region covering more than one half of said fuse link and said second silicide region covering less than one half of said fuse link.

* * * * *